US012684919B2

(12) United States Patent (10) Patent No.: US 12,684,919 B2
Willem et al. (45) Date of Patent: Jul. 14, 2026

(54) LIGHT EMITTING MODULE FOR A LIGHT EMITTING DISPLAY

(71) Applicant: BARCO N.V., Kortrijk (BE)

(72) Inventors: Patrick Willem, Ostend (BE); Bart Van Den Bossche, Marke (BE); Peter Gerets, Roeselare (BE); Wim Van Eessen, Kruishoutem (BE)

(73) Assignee: BARCO N.V., Kortrijk (BE)

( * ) Notice: Subject to any disclaimer, the term of this patent is extended or adjusted under 35 U.S.C. 154(b) by 393 days.

(21) Appl. No.: 18/572,246

(22) PCT Filed: Jun. 30, 2022

(86) PCT No.: PCT/EP2022/068036
§ 371 (c)(1),
(2) Date: Dec. 20, 2023

(87) PCT Pub. No.: WO2023/275228
PCT Pub. Date: Jan. 5, 2023

(65) Prior Publication Data
US 2024/0290927 A1 Aug. 29, 2024

(30) Foreign Application Priority Data
Jun. 30, 2021 (LU) ........................................ 500367

(51) Int. Cl.
*H10H 20/857* (2025.01)
*H10D 86/40* (2025.01)
(Continued)

(52) U.S. Cl.
CPC .......... *H10H 20/857* (2025.01); *H10D 86/40* (2025.01); *H10D 86/60* (2025.01);
(Continued)

(58) Field of Classification Search
None
See application file for complete search history.

(56) References Cited

U.S. PATENT DOCUMENTS 7,071,894 B1 7/2006 Thielemans et al.
7,176,861 B2 2/2007 Dedene et al.
(Continued)

FOREIGN PATENT DOCUMENTS

DE 102018122007 3/2020
EP 2722415 4/2014
(Continued)

OTHER PUBLICATIONS

ISR and Written Opinion for PCT/EP2022/068036 dated Oct. 17, 2022 (16 pages).

*Primary Examiner* — Sue A Purvis
*Assistant Examiner* — Jordan M Klein
(74) *Attorney, Agent, or Firm* — HSML P.C.

(57) ABSTRACT

A light emitting module for a light emitting display, including a first backplane and a third backplane arranged in a stackup. The first backplane includes a thin film transistor (TFT) layer deposited on a first substrate, the TFT layer further including a plurality of light emitting elements, associated contact pads and conducting tracks. The third backplane is provided on top of the light emitting elements, includes cavities at the locations of the light emitting elements and comprises includes at least a ground layer and a power layer. The upper and lower layers of the third backplane are provided by alternatively the ground layer and the power layer for contacting the light emitting elements.

28 Claims, 11 Drawing Sheets

(51) Int. Cl.
     *H10D 86/60*     (2025.01)
     *H10H 20/851*     (2025.01)
     *H10H 29/14*      (2025.01)

(52) U.S. Cl.
     CPC .... *H10H 20/8512* (2025.01); *H10H 20/8515*
                 (2025.01); *H10H 29/142* (2025.01)

(56)                 References Cited

U.S. PATENT DOCUMENTS

| | | | |
|---|---|---|---|
| 7,450,085 | B2 | 11/2008 | Thielemans et al. |
| 7,972,032 | B2 | 7/2011 | Meersman et al. |
| 2020/0343230 | A1* | 10/2020 | Sizov .................... H10W 90/00 |
| 2021/0126154 | A1* | 4/2021 | Kim ...................... H10H 20/01 |
| 2021/0265540 | A1* | 8/2021 | Itou ..................... H10H 20/856 |

FOREIGN PATENT DOCUMENTS

| | | |
|---|---|---|
| EP | 3711462 | 9/2020 |
| EP | 3813110 | 4/2021 |
| WO | 2015079058 | 6/2015 |
| WO | 2019185935 | 10/2019 |
| WO | 2020100407 | 5/2020 |
| WO | 2020126059 | 6/2020 |

* cited by examiner

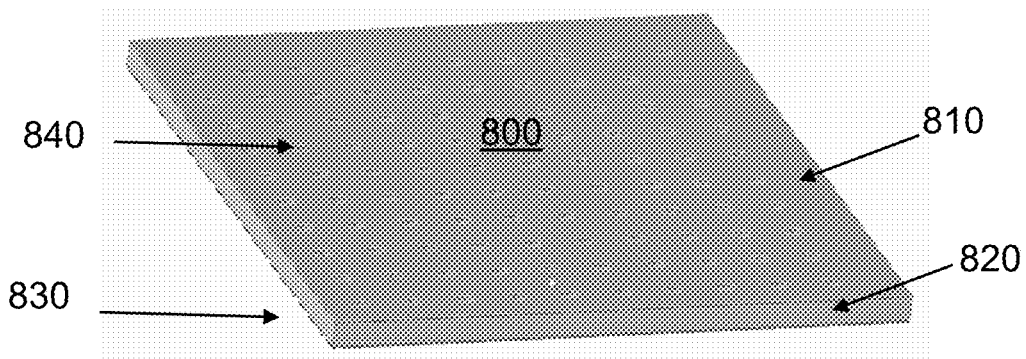
FIG 3A
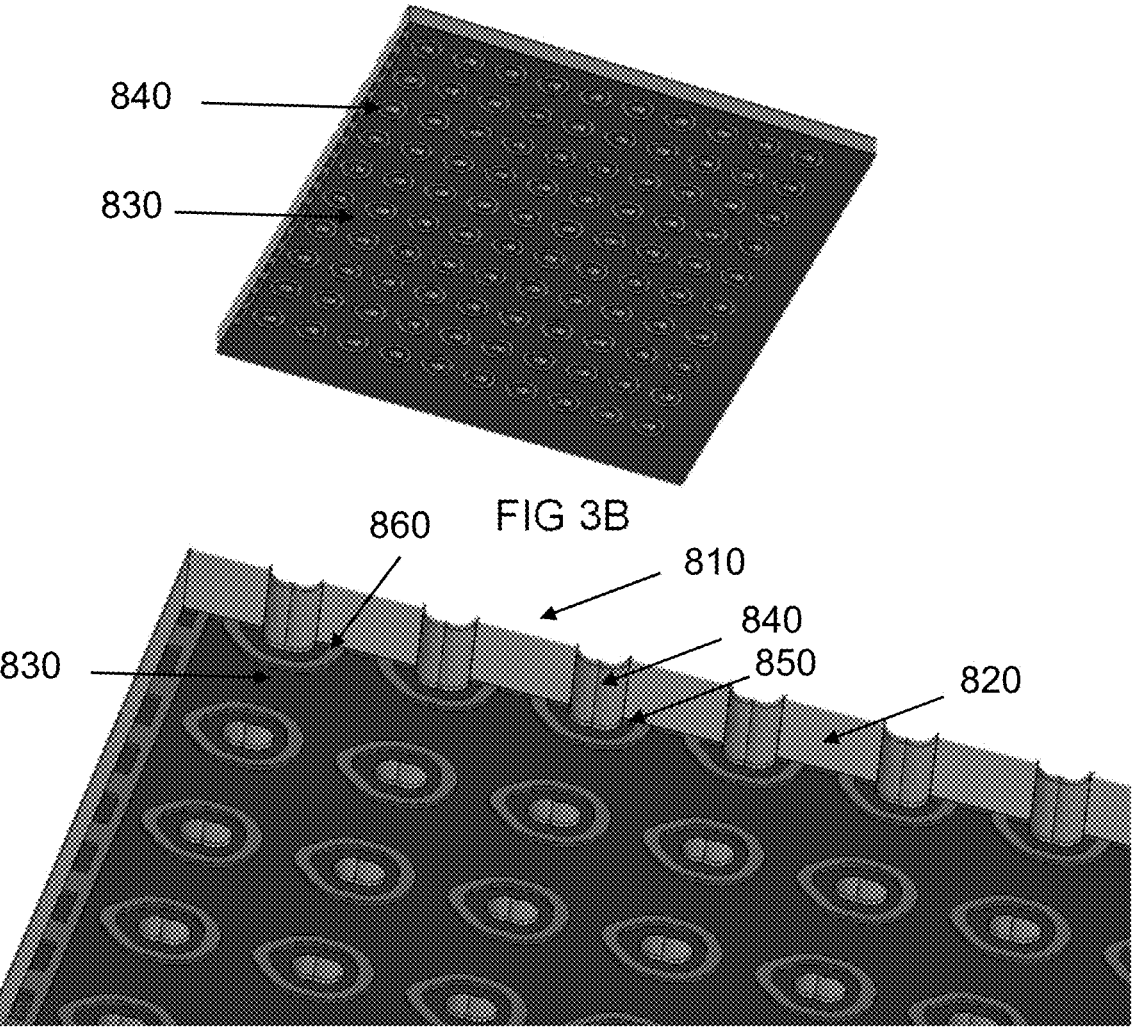
FIG 3B
FIG 3C 81
82
83
84
85

LIGHT EMITTING MODULE FOR A LIGHT EMITTING DISPLAY

TECHNICAL FIELD BACKGROUND

The present disclosure relates to the field of light emitting modules, display modules and tiled displays.

BACKGROUND

A light emitting display is usually made of a plurality of light emitting modules. Various light emitting modules can be driven by the same carrier (for example a PCB interposer), or each module can have its own dedicated carrier. It is however important that on the assembled light emitting display, the seams between adjacent modules remain invisible.

Additional challenges associated with having an assembly of light emitting modules, is that it is difficult to provide a display whose modules are perfectly aligned to provide a flat display. For example, patent application WO2020126059A1 from the same applicant provides a solution to perfectly align the various modules of the light emitting display. It teaches how to make a display with improved flatness, wherein the display tile comprises a display board and a carrier board, the carrier board being for attachment to a frame or a bracket, the display board and the carrier board being fastened together by the intermediary of a spacer positioned between the display board and the carrier board. The spacer is glue or adhesive. The adhesive forms the spacer itself. The spacer can engage in an opening in the carrier board. The display board has image forming elements and the spacer is for setting a relative position of the tops of the image forming elements with respect to the carrier board.

It is a current trend to use light emitting elements having a smaller size to improve the display resolution. Today's trend is to build displays with for example micro LEDs (LEDs).

The use of micro LEDs (μLEDs) in LED display technology brings about new challenges to be solved. μLEDs have, as indicated in the name, a micrometer-size scale. Accordingly, they also require micrometer size scale contacting methods.

Currently, a lot of novel methods are under investigation as traditional contacting methods, such as soldering, gluing, are not possible with μLEDs, especially since these materials need to be precisely applied on the target by either reflow stencil (limited in aperture and positioning tolerances) or XY dispensing equipment (limited in volume and XY positioning accuracy during dispensing).

Furthermore, due to the small contact pads, the μLED architecture cannot be based on PCB anymore. In fact, the use of PCB restricts the dimensions of the wires to a size which is even larger than the LEDs themselves. The industrial manufacturing process has limitations. The substrates need to be lithographically defined (cf. LCD, OLED, silicon chips, etc.) and comprises single-sided contacts and processing due to the process technology (e.g., TFT LTPS technology). The contacting will pose a problem on traditional substrates (like PCB) but also the connectivity between the contact points (traces on the PCB) will be limited by the technology. The main problem is the gap between the two contact pads that are out of PCB capabilities.

The only possible solution to achieve high precision in contact size and contact positioning on a larger surface is with TFT technology on glass or on another stiff and flat substrate susceptible to receive a TFT layer, such as ceramics that are used for chips. A disadvantage of using glass as supporting carrier for (μ)LED applications is the lack of Cu routing layers to connect the LEDs in either an AM or PM structure to the driving components. In AM, part of the driving is accomplished by TFT integration on the glass. For PM driving, the LEDs can be placed in a row/column driving structure where the rows and columns need to connect to the driving chips, e.g. located on a PCB on the backside of the glass panel and connected by side connects.

Since the μLED technology is intended to create high resolution LED displays (e.g., pitch 0.317 mm for 4K 55"), the available routing space in between the LEDs is very limited, and only single layer.

In addition, the use of μLEDs requires higher driving currents compared to current available display technologies like LCD and OLED. This implies a potential problem for power routing and routing of scanlines, rows, drivers. The thickness of Cu layers on glass is in the range of 1 to 4 μm, which results in high resistive values and more voltage drop over the panel.

Currently, most LED displays are driven by passive matrix drivers, located on the backside of the LED panels, to keep the distance between the chip and the LED as low as possible and thereby avoid performance reduction due to parasitic effects. Since the technology of μLEDs will be TFT single side based, this is not possible anymore.

In active matrix displays, the need for zero bezel displays is increasing. However, the pixel pitches are getting smaller and smaller, to achieve higher resolution displays (4K, 8K), the number of contacts on the side is exponentially increasing.

In a tillable system where no bezel is desired (like LED displays), the pixel pitch determines the distance required to wire out these contacts to back electronics. In the past this could be solved with side contacting, as for example described in patent application WO2015079058A1, however due to the space between modules and the contacts which are getting too small, this is not possible anymore.

There is therefore a need to provide a method to assemble two light emitting modules with a very small seam between the modules such that the seam is invisible to the viewer. Many contacts need to be made with a very fine pitch. It is also not possible to achieve such a fine pitch with a flex mount contact. Another possibility would be to provide a flex PCB on the top side, and then to bend it. However, the bending radius is still too big to fit in the space available due to the pixel pitch on the panel.

A (μ)LED display is thus usually composed of a plurality of LED modules. There is thus the need to solve the following problems to provide a display having no visual artefacts:

provide means to connect all the drivers to the μLED module backside, without disturbing the pixel pitch, provide means to connect all the μLED modules to a controlling unit, provide means to create a seamless assembled module (mechanically) by reducing the seam between adjacent μLED modules.

provide means to ensure that the seamless assembled module is also flat.

There is thus a need for improvement in the art.

SUMMARY

According to a first aspect, there is thus provided a light emitting module for a light emitting display, comprising a first and a third backplane arranged in a stackup, wherein the first backplane comprises a thin film transistor layer deposited on a first substrate, the thin film transistor layer further comprising a plurality of light emitting elements, associated contact pads, conducting tracks and semiconductor material. The third backplane is provided on top of the light emitting elements and comprises cavities at the locations of the light emitting elements and at least a ground layer and a power layer, said ground layer and power layer being arranged on the first backplane and an upper layer, wherein the lower and upper layer are provided by alternatively a ground layer and a power layer for contacting or providing power to the light emitting elements.

The upper layer also corresponds to the outer surface of the light emitting module. The lower layer is an inner layer of the light emitting module, and is directly in contact with the TFT layer on the first substrate.

Providing a third backplane on top of the first backplane brings the possibility to reduce the number of tracks in the TFT layer. Larger copper tracks can therefore be provided for ground and power signals in the third backplane. Voltage drop is thereby reduced. In addition, the TFT can provide finer tracks for smaller components, which can be arranged very close next to each other. Higher driving currents can thus also be provided to the light emitting elements.

In addition, the cavities for arranging the light emitting elements provide many advantages, in terms of EMI shielding, optical rendering.

In addition, hot spots are avoided on the display by using copper planes functioning as heat spreaders.

Side contacts are enabled with bigger contact area, by providing copper tracks with a greater thickness available on the upper and lower layer of the third backplane.

The cavities in the third backplane can be metallized (as via's) and connect power and ground, coming from the side to the connected locations on the first backplane. Power coming to the PCB can be implemented by providing a side connection to the third backplane.

The upper layer can be the power layer, the lower layer can be the ground layer or the upper layer can be the ground layer and the lower layer can be the power layer.

These two options are technically equivalent. However, it is preferred that the ground upper layer is the ground layer for EMI shielding.

An insulating layer can be provided between the upper layer and the lower layer, preferably the insulating layer is PI, FR4, Teflon.

The cavities can be metalized for connecting the upper layer to the lower layer.

Metalizing the cavities provides means to electrically connect the layers in the third backplane to the conducting tracks of the light emitting elements. In addition, the metalized cavities have optical properties which improve the rendering of the display.

It is an advantage that each cavity can be surrounded by an insulating ring thereby providing an isolated island around each cavity, such that the electrical functionality of the upper layer is transmitted to the isolated island, the isolated island thereby comprising the power if the upper layer is the power layer or the ground if the upper layer is the ground layer.

In addition, conducting tracks of the light emitting elements can connect each contact pad to a ground connection and a power connection, said ground and power connection configured to be in contact with the lower layer and the isolated island or the opposite.

The anode and cathode can thus easily be connected to the third backplane using this scheme.

The third backplane can further comprise intermediate conducting layers.

The intermediate conducting layers can be any one of a scanning line layer, a R data layer, a G data layer, and a B data layer.

Additional functionalities can thereby be provided to the third backplane, and thereby the functionalities of the display may further be improved.

The cavities can be metalized for connecting the upper layer and the intermediate layers to the lower layer.

Such a solution avoids the use of side contacting means, or reduces the number of connections in the side contacting means, which increase the seam between adjacent light emitting modules. Such a solution is also simple to implement and provides many possibilities.

The lower layer can comprise an isolated island around each cavity, the isolated island being surrounded by an insulating ring, and the isolated islanded being configured to connect to another layer by means of the metalized cavity wall.

The layers which can be connected by the metalized cavity wall to the lower layer comprise an isolated island on the layer around the cavity wall.

An insulating ring can be provided around the metalized cavity wall on the layers not to be connected.

A proper arrangement of insulating rings, isolated islands and metalized cavity walls provides means to configure the routing of the signals between different layers as required by the application.

Optionally, the signals to at least one layer of the third backplane are routed by side connections.

Connections on the side may still be used in combination with the connections inside the cavities.

The third backplane can be a PCB backplane. A PCB backplane is available off the shelf and can be implemented with thick copper planes, which is advantageous for routing the required signals.

A pixel can be composed of a red, a green and a blue sub-pixel, the sub-pixels being provided by light emitting elements.

It is an advantage that the first substrate is made of an insulating material configured to receive a TFT layer, such as polyimide (PI), polymer, plastic, glass, ceramics, silicon, alumina, silicon carbide.

The light emitting elements can be any one of LEDs, OLEDs, and variations thereof, QD-LEDs, EL-QLEDs, AMOLEDs, mini-LEDs, micro-LEDs. The present invention applies to any type of light emitting element.

The cavities can preferably be used for providing at least one secondary optics, such as quantum dots, light scattering means, contrast enhancing means, light directivity means, light absorbing particles, polarization filters.

The cavities are not only beneficial for providing EMI shielding and enabling the use of a third backplane on top of the first backplane, but also provide the advantage to implement secondary optics inside the cavities. When the depth of the cavity is sufficient, different secondary optics can be combined.

The quantum dots and appropriate blue/UV light emitting elements can be provided for any one of the red and/or the green and/or the blue color. The use of quantum dots in LED displays is very beneficial.

All light emitting elements can be identical, and the quantum dot fillings are configured to provide any of red and/or green and/or blue colors.

The upper layer of the third backplane can be covered by a black mask.

The third backplane can be connected to the first backplane by means of any one of anisotropic conductive film (ACF), conductive glue, nano entanglements, or solder ball The surface of the third backplane can be greater than the surface of the first backplane. Increasing the surface of the third backplane may reduce the visible seam between adjacent light emitting modules.

The third backplane can be provided by the core of a multi layer PCB. PCB cores are available off the shelf. Such cores generally comprise two layers which are very well aligned one with respect to the other. The alignment is sufficiently precise for micro-LEDs applications for example.

It is an advantage that the thickness of the PCB core laminate can be comprised in the range of 50 to 300 microns.

The diameter of the cavities is preferably larger than the diameter of the light emitting elements. For example, the diameter of the light emitting elements can be approximately 75 microns, and the diameter of the light emitting elements is about 54 microns. Micro LEDs have a diameter of about 54 microns. Therefore, a diameter of about 75 microns is ideal. Such a diameter is available in the PCB industry.

The cavities can be funnel shaped. Any shape can be provided to the cavities, and the shape can be adapted to the type of secondary optic which is to be provided.

The additional layers can be provided by a PCB multi-layer stack up.

A solder mask can be printed on the upper surface of the third backplane.

Optionally, there is also provided a light emitting module further comprising a second backplane, wherein the second backplane is provided under the first substrate of the first backplane, the second backplane is configured to provide at least driving signals to the light emitting elements, and the second backplane is connected to the first backplane by means of through holes in the first substrate or by means of side contacts.

Optionally, side contacting can also be used. It can enable the contacting to all layers if the contact covers all three backplanes.

Further benefits and advantages of the present invention will become apparent after a careful reading of the detailed description with appropriate reference to the accompanying drawings.

BRIEF DESCRIPTION OF DRAWINGS

The features of the invention believed to be novel are set forth with particularity in the appended claims. The invention itself, however, may be best understood by reference to the following detailed description of the invention, which describes an exemplary embodiment of the invention, taken in conjunction with the accompanying drawings, in which:

FIG. 3A is a schematic representation of the upper layer of a third backplane comprising cavities for the light emitting elements according to an example.

FIG. 3B is a schematic representation of the lower layer of a third backplane shown in FIG. 3A.

FIG. 3C is a closer view of the cavities shown in FIG. 3B.

DESCRIPTION OF EMBODIMENTS

Figures 1A, 1B, 1C:
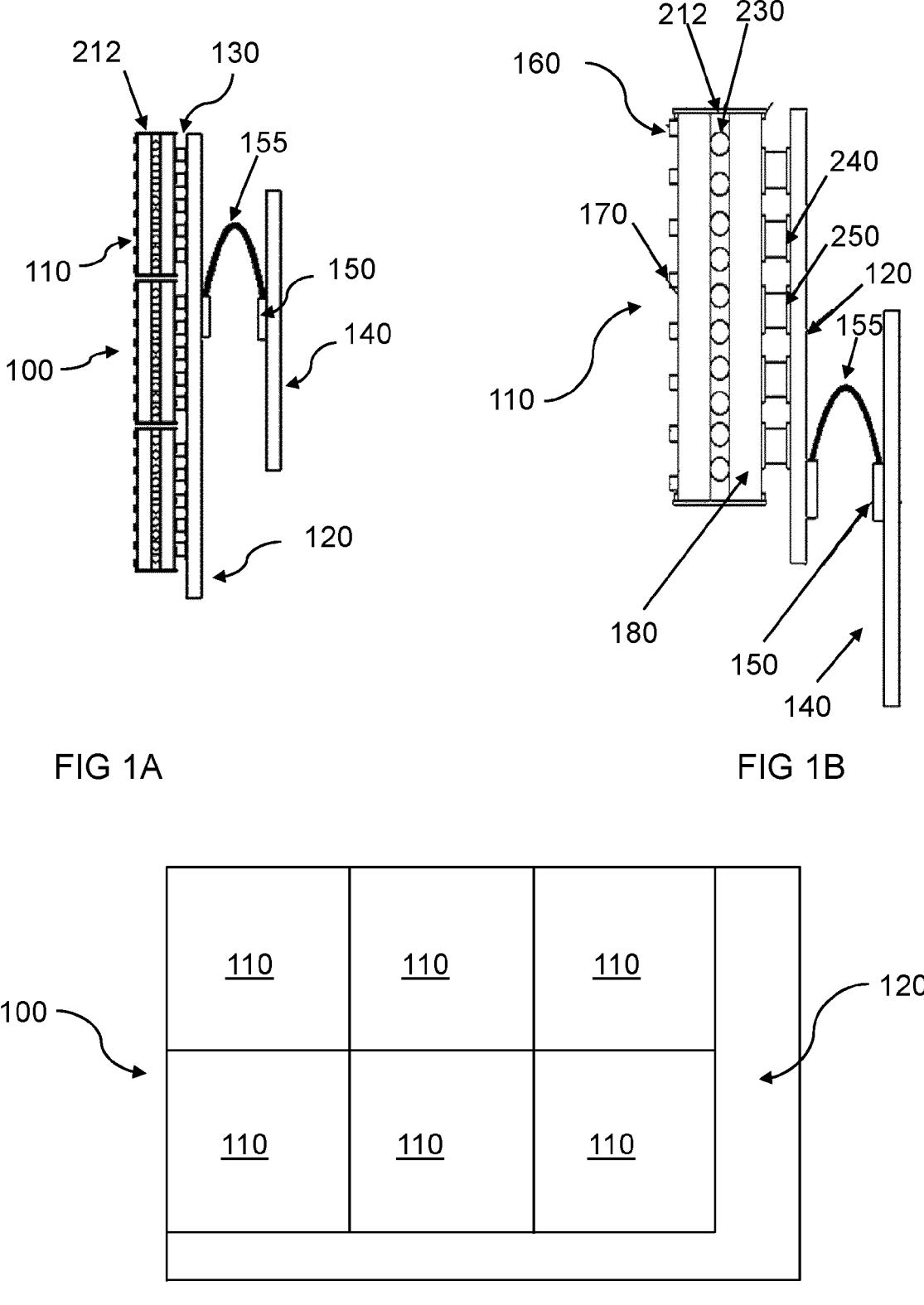
FIG. 1A is a side view of a light emitting module for a display module.
FIG. 1B is a close view of FIG. 1A.
FIG. 1C is front view of a display module comprising a plurality of light emitting modules.

Terminology used for describing particular embodiments is not intended to be limiting of the invention. As used herein, the singular forms "a", "an" and "the" are intended to include the plural forms as well, unless the context clearly indicates otherwise. The term "and/or" includes any and all combinations of one or more of the associated listed items. It will be understood that the terms "comprises" and/or "comprising" specify the presence of stated features but do not preclude the presence or addition of one or more other features. It will be further understood that when a particular step of a method is referred to as subsequent to another step, it can directly follow said other step or one or more intermediate steps may be carried out before carrying out the particular step, unless specified otherwise. Likewise it will be understood that when a connection between structures or components is described, this connection may be established directly or through intermediate structures or components unless specified otherwise.

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. Where the term "comprising" is used in the present description and claims, it does not exclude other elements or steps.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The terms "about" or "approximate" and the like are synonymous and are used to indicate that the value modified by the term has an understood range associated with it, where the range can be +20%, +15%, +10%, +5%, or +1%. The term "substantially" is used to indicate that a result (e.g., measurement value) is close to a targeted value, where close can mean, for example, the result is within 80% of the value, within 90% of the value, within 95% of the value, or within 99% of the value.

Definitions and Acronyms

Active Matrix.

Active matrix is a type of addressing scheme used in flat panel displays. In this method of switching individual elements (pixels), each pixel is attached to a transistor and capacitor actively maintaining the pixel state while other pixels are being addressed.

Active-matrix circuits are commonly constructed with thin-film transistors (TFTs) in a semiconductor layer formed over a display substrate and employing a separate TFT circuit to control each light-emitting pixel in the display. The semiconductor layer is typically amorphous silicon, polycrystalline silicon and is distributed over the entire flat-panel display substrate. An active matrix display can also be for example an LCD or an electrophoretic reflective transmissive emitting display or similar.

A display sub-pixel can be controlled by one control element, and each control element includes at least one transistor. For example, in a simple active-matrix light-emitting diode display, each control element includes two transistors (a select transistor and a power transistor) and one capacitor for storing a charge specifying the luminance of the sub-pixel. Each LED element employs an independent control electrode connected to the power transistor and a common electrode. Control of the light-emitting elements in an active matrix known to the art is usually provided through a data signal line, a select signal line, a power or supply connection (referred to as e.g., VDD) and a ground connection.

Backplane is a board comprising electronic components configured to drive the light emitting display. A backplane can be for example a PCB backplane (e.g., FR4 PCB), or a TFT backplane.

BGA Ball Grid Array

Carrier board refers to a board which is configured to receive at least one light emitting module or display module. It serves as a support structure of a tiled display. The carrier board can be a backplane or a mechanical support structure. It can also serve as a distribution panel for power, ground and to distribute driving signals for the light emitting elements.

Driving signals or data signals are the signals which comprise the information for driving the light emitting elements to generate an image on the display. Depending in which stage they are in the transmission flow, they may be digital signals, or analog signals, or optical pulse signals, etc.

Display

A display screen can be composed of light emitting pixel structures referred to as "display pixels" or "pixels" where the amount of display pixels determines the "display resolution", sometimes referred to as the "native display resolution" or the "native pixel resolution". A measure of the display resolution can be the total number of display pixels in a display, for example 1920×1080 pixels. Each display pixel can emit light in all colors of the display color gamut (i.e. the set of colors the display is able to provide).

Each display pixel can be composed of light emitting elements referred to as "sub-pixels", often being able to emit the colors red (R), green (G) or blue (B) (but also white, yellow or other colors are possible). A display pixel can be composed of at least three sub-pixels: One red, one green and one blue sub-pixel. Additionally, the display pixel can comprise other sub-pixels in any of the aforementioned colors (to further increase the color gamut). Depending on the types of sub-pixels, the display pixel can then be referred to as a RGB-, RGGB-, RRGB-pixel, etc. While a single display pixel can generate all colors of the display color gamut, a single sub-pixel cannot.

The light emission of a single sub-pixel can be controlled individually so that each display pixel can emit the brightness and color required to form the requested image.

Display module is a module which comprises at least one light emitting module arranged on a carrier. The carrier of the display module is configured to transfer driving signals and power signals to the at least one light emitting module.

A plurality of display modules can be placed on a bigger carrier board (mechanical interface) to create a tiled display and be connected to an external driver or the display module. The functionalities of the driver can also be embedded in the display module.

Duty Cycle The term duty cycle describes the proportion of 'on' time to the regular interval or 'period' of time; a low duty cycle corresponds to low power, because the power is off for most of the time. Duty cycle is expressed in percent, 100% being fully on.

FR-4 (or FR4) is a NEMA grade designation for glass-reinforced epoxy laminate material. FR-4 is a composite material composed of woven fiberglass cloth with an epoxy resin binder that is flame resistant (self-extinguishing). "FR" stands for flame retardant.

Reference to Insulating implicitly assumes it is electrically insulating, such insulating ring or insulating material, or insulating substrate refers to electrically insulating ring, or electrically insulating material or electrically insulating substrate.

LED. Light Emitting Diode

Light Emitting Element. A light emitting element can be e.g., a solid-state light emitting element, such as a light emitting diode such as an LED or an OLED (Organic LED).

Light Emitting Module

A light emitting module is an opto-mechanical-electronic carrier of a certain size which carries light emitting elements directed towards a viewer and possible light emitting elements driving and control electronics. These light emitting elements are driven to create an image, either static or dynamic (video). In the following the light emitting module will be called an "LED module", although the invention is not restricted to LEDs. Several LED modules or OLED modules can be positioned next to each other to form a display module. Several display modules can be tiled together to form a larger tiled display.

A small LED module which is an atomic element, i.e., indivisible, can be called a "stamp". The light emitting module can have any size and shape. It can be rectangular or square, hexagonal, triangular, any shape, if it fits in a pick and place robot used to place it on a display module. It can also comprise one pixel, which comprises a red, green, and blue light emitting element.

The light emitting module comprises at least one backplane. The top surface of the backplane comprises the light emitting elements and associated conducting tracks which connect the various light emitting elements to various electronic components (like e.g., current drivers, power supply contacts etc.). The backplane can be a PCB, TFT on glass, TFT on PI, etc.

The following patent applications, from the same applicant, provide definitions of LED displays and related terms. These are hereby incorporated by reference for the definitions of those terms.

U.S. Pat. No. 7,972,032B2 "LED Assembly"

U.S. Pat. No. 7,176,861B2 "Pixel structure with optimized subpixel sizes for emissive displays"

U.S. Pat. No. 7,450,085 "Intelligent lighting module and method of operation of such an intelligent lighting module"

U.S. Pat. No. 7,071,894 "Method of and device for displaying images on a display device".

MUX Multiplexer

PAM Pulse Amplitude Modulation

Passive Matrix (PM) Passive matrix addressing is an addressing scheme used in early LCDs. This is a matrix addressing scheme meaning that only m+n control signals are required to address an m×n display. A pixel in a passive matrix must maintain its state without active driving circuitry until it can be refreshed again.

PWM Pulse Width Modulation

Pulse-width modulation uses a rectangular pulse wave whose pulse width is modulated resulting in the variation of the average value of the waveform. The square wave has a period T, a lower limit 10 (typically 0 in our case), a higher limit 11 and a duty cycle D. The duration of one pulse P (the time during which the signal is at its higher limit) is D/100*T (if D is expressed in %). For instance, if D=50%, the duration of the pulse is ½ T. A more complete definition can be found in WO2019185935A1 from the same applicant.

TGV Through Glass Via

Thin-film technology (TFT) refers to the use of thin films: A film a few molecules thick deposited on a glass, ceramic, or semiconductor substrate to form for example a capacitor, resistor, coil, cryotron, or other circuit component. A film of a material from one to several hundred molecules thick deposited on a solid substrate such as glass or ceramic or as a layer on a supporting liquid. TFT can be deposited on a substrate such as glass or PI. It comprises multiple layers of wiring, semiconductors, and isolation layers.

DESCRIPTION

While the invention is illustrated and described mostly in reference to LEDs or micro LEDs, the invention is not limited thereto, and may also be advantageous for other the types of light emitting elements, as defined in the present application.

While the first part of this patent application discloses the use of a second backplane provided under a TFT layer for driving light emitting elements, such as LEDs, wherein this second backplane can be for example a PCB, the second part of the application discloses the use of a third backplane provided on top of the first backplane, i.e., for example a PCB on top of the TFT layer for driving the LEDs.

In a third part of the application, it will be shown how both, the second backplane under the first backplane, and the third backplane on top of the first backplane can be combined to provide a light emitting module or display module arranged in a stackup of at least three backplanes (depending on the dimensions of the second backplane).

FIGS. 1A, 1B and 1C illustrate an example of a light emitting module 110 for a display module or display 100. In FIG. 1C, the display module 100 comprises a plurality of light emitting elements 110 arranged on carrier 120. The light emitting elements can be any of the light emitting elements provided in the definition section. However, for the sake of clarity, LEDs will be used in the illustrated examples. Thus, an LED display (or display module) 100 comprising a plurality of LED modules 110 is hereby shown. FIG. 1A provides a side view of the display, while FIG. 1C provides a front view and FIG. 1B a close-up of FIG. 1A. Each module 110 is fixed to a carrier 120 through contacting wires 130, which provides a mechanical and electrical connection. The carrier is further connected to an external driver 140 via a flexible conductor 155 connected to an external driver connector 150 configured to provide driving and control electronics.

The carrier 120 can be a PCB or TFT backplane with or without driver electronics. In the figure above the carrier 120 is a TFT backplane which is connected via a flexible conductor 155 to a driver PCB with driver electronics 140. The flexible conductor can be provided by for example a flexible PCB (flex PCB).

In FIG. 1B, a closer view of the LED module 110 is shown. In this example, the LED module comprises two backplanes arranged in a stack up, a front 170 and a back 180 TFT backplanes. The front and/or the back backplanes could also be PCBs. Thus, any combination of front/back TFT backplane/PCB backplane are possible. The present example is illustrated with TFT backplanes.

The connection from the front 170 to the back 180 backplanes is usually done with a contact strip 212 on the edges. The balls 230 between the two TFT backplanes are spacers to control the distance between the two TFT backplanes. This LED module 110 is also connected to a carrier 120 through connections 240. Here in this example, the carrier 120 is a PCB. After assembly, both front 170 and back 180 TFT backplanes are glued together with spacers in between to maintain planarity and parallelism between them.

The use of micro LEDs in displays brings about new challenges. In fact, as mentioned, micro-LED displays are preferably driven in a similar way as LCD displays, i.e., by active matrix. Therefore, TFT technology should be used.

The distance between the anode and the cathode of a micro-LED is about 20-40 microns. Therefore, the space between two adjacent LEDs is also drastically reduced. In this space, the contacting pad of an LED needs to fit. The space between two adjacent contacting pads can be of about 35 microns.

To feed each micro-LED with driving signals, each pad on the TFT layer needs to be accessed by an electrical connection. However, there is no space on the sides of an LED module to provide such connections, as shown in the example of FIG. 2A for example with the side contact strips 212.

There is thus a need to provide for example backside access to the μLEDs to avoid side contact strips and such that the driving functionalities of each LED may be arranged as close as possible to the μLED itself on the TFT.

In addition, the following constraints may need to be considered:

TFT processing is limited to one side of the substate. In the case of μLEDs, there is a high need for power efficient routing because the μLEDs are individually current driven. The driving of PWM based μLED displays is much more complex than current LCD and OLED driving, thus the functionality per pixel is higher in this case.

Due to the complexity of such μLED displays, a single stack up LED module may still not provide sufficient space to provide all the functionalities required by a pixel. The LED modules may therefore comprise more than one backplane, and be a stackup of at least two backplanes, a first backplane and a second backplane. For example, a stackup of two TFT backplanes or a TFT and PCB backplane, wherein each layer of the stackup (backplane) is dedicated in the provision of certain control functionalities for driving the light emitting elements of the display.

To increase the available area on the substrate to functional designs, a new way is needed to distribute the power and/or driving signals between the μLED pixels.

First Part

One possibility is to access each contacting pad of the light emitting elements provided on the TFT layer not from the side, but from under the TFT layer.

A TFT layer is usually deposited on an insulating substrate. Reference to an insulating substrate throughout the description shall be interpreted in the sense of electrically insulating substrate. To be able to electronically access the contacting pads of the light emitting elements on the TFT layer from under, through holes shall be made in the insulating substrate until the lower surface of the contacting pads has been reached.

The substrate can be made of insulating material and includes an embedded TFT active matrix.

It is therefore desirable to use a material in which through holes can easily be manufactured.

In LCD displays for example, the TFT layer is typically processed on a glass layer. To get access to the contacts at the top, a solution is to provide TGV (through glass vias) in the glass. TGV on glass is typically provided in distribution layers for silicon. However, it is less common in the field of displays due to the manufacturing costs and the higher workload required, i.e., drilling and metallization. TFT processing is also available on other materials, such as PI (Polyimide flexible substrate).

It is common to use PI in electronics for providing flexible substrates. However, it is less common to use PI in a TFT process. PI is normally spin coated on a glass layer. The TFT layer is then deposited. This is possible since the thermal expansion of both PI and glass is very similar during the process. The glass layer can then be removed by laser ablation.

The advantage of polyimide is that it is a flexible substrate, sufficiently thin, such that through holes can be manufactured within the substrate.

In fact, the first substrate provided by an insulating material may further fulfill the following requirements.

It is preferred that the material of the substrate is sufficiently flat and stiff such that TFT can be processed on it, for example, glass or silicon carbide. If the material is not stiff, but flexible, it is important that the material has a coefficient of thermal expansion similar to the substrate on which the TFT layer is processed such that no shear constraints appear during the TFT process. This is the case for example for PI and glass.

In addition, brittle materials are less preferred as it is more difficult to manufacture holes inside. In addition, it is preferred to have a thin material.

Polyimide is a preferred material as TFT can be processed on it, as described above, and through holes can easily be made. PI has the advantage that it can be made very thin, for example with a thickness in the range of 20 to 25 microns.

The light emitting module may comprise a first backplane which comprises a thin film transistor layer deposited on a first substrate, the thin film transistor layer further comprising a plurality of light emitting elements and first contact pads and associated conducting tracks.

The first substrate can be any insulating material suitable to receive a TFT layer, such as polyimide (PI), polymer, plastic, glass, ceramics, silicon, alumina, silicon carbide.

The substrate can be made of an insulating material and includes an embedded TFT active matrix.

Through holes can thus be provided in the first substrate at the locations of each first contact pad, to be able to contact and drive the light emitting elements of the display.

Figure 2:
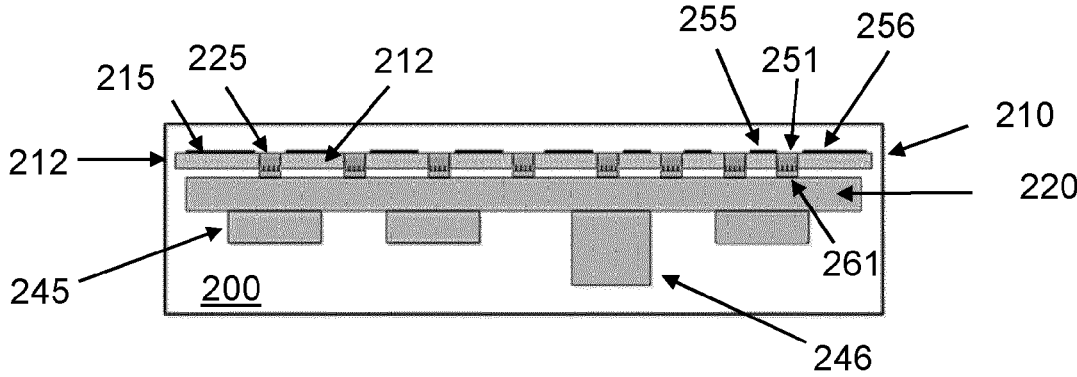
FIG. 2 is a light emitting module.

FIG. 2 illustrates another example of a light emitting module. The light emitting module 200 comprises a first backplane 210 and a second backplane 220. The first backplane comprises a thin film transistor layer 215 deposited on a first substrate 212, the thin film transistor layer further comprising a plurality of light emitting elements 255, first contact pads 251, and associated conducting tracks 256.

As illustrated in FIG. 2, a plurality of through holes 225 can be provided in the first substrate 212, at the locations of the first contact pads 251. The through holes are such that they extend to the lower surface of the first contact pads.

The light emitting module 200 may also comprises a second backplane 220 which comprises second contact pads 261 configured to provide driving currents and power supply to the first contact pads 251 of the light emitting elements 255.

To connect the second contact pads 261 to the first contact pads 251, first electrical binding means are provided in the through holes of the first backplane which connect to the lower surface of the first contact pads. Second electrical binding means are provided on the second contact pads of the second backplane, the first and second electrical binding means being connected such that the driving currents and/or power supply from the second backplane are transmitted to the first backplane.

It is important to state that the through holes provided in the first backplane are optional.

In the examples outlined, there are different ways to provide the first and second electrical binding means. These binding means can be used in all the examples shown in the present description.

The electrical binding means can preferably fulfill the following requirements:

depending on the application, they need to be sufficiently precise (for example, at the level of a few microns for micro-LED displays), they should preferably be applied at low temperature, preferably room temperature, such that the TFT layer is not damaged during the process. In fact, TFT is very sensitive to temperature, as its properties can be altered irreversibly if higher temperatures are used. In addition, these means should preferably also provide a mechanical connection.

A preferred means is the use of nano entanglements. Such nano entanglements are for example described in the following patent applications: EP3711462A1 and DE102018122007A.

This technology allows to achieve both an electrical and mechanical connection simultaneously. This new method describes the possibility to grow conductive nanometer sized wires to a desired length in a controlled way on conductive surfaces (e.g., Cu, Au) in a batch process. This method further can be used on a larger scale to increase the contacting area for high current devices (power LEDs, power distribution connectors). No solder or glue is required to make the connection. This technology is very interesting for critical applications. In addition, since it is a mechanical connection, control on X, Y, Z and rotation is under control. This technology is also a Galvano process, which allows to grow nano entanglements inside cavities. In addition, it is applied at room temperature which is advantageous for not damaging the TFT layer.

In the present application, such Cu nano entanglements can be grown on both contacting areas (e.g., μLED first contact pad and a second contact pad on the second backplane).

In addition to a very good electrical connection, they also provide a high mechanical connection. Nano entanglements are irregular in shape, which results in a better contacting surface. In fact, the wires behave in a similar way to brushes. The friction and contacting surface are thus maximized when such brushes are assembled, which results in a very stable connection. In addition, they have the advantage of accommodating any surface flatness variation or roughness, as will be described later.

In all the examples shown, the use of nano entanglements as electrical binding means is therefore particularly advantageous.

Other electrical binding means, which offer similar advantages as those described above, are for example conductive glue, known as "UP 400" described for example in the following patent application: EP2722415A1.

Other electrical binding means include the use of ACF or anisotropic conductive foil.

Other methods like fuse bonding, thermal compression bonding (creating intermetallic with heat and pressure), laser soldering, etc. are valid solutions as long as the material can withstand the process parameters, in particular heat. There are methods of 'mass bonding' by thermal compression where a matrix of μLEDs is arranged on a thermal resistant tape and then mounted on a substrate by a thermal process.

If the application does not require the same resolution as micro LEDs, other technologies, which are less precise, may also be used to provide electrical binding means in the through holes. For TFT, it is important to use a process which is applied at low temperatures (room temperatures).

A solution to electrically and mechanically assemble two backplanes arranged in a stackup by avoiding side contacting to reduce the seam and provide an invisible connection between the backplanes is hereby provided. This can be generalized to any number of stackups. It can also be generalized to other applications then displays. For example, instead of the light emitting elements, other types of sensors, such as for example photometers can be used.

In fact, new means to connect contact pads of a semiconductor device provided on a first backplane to a second backplane are provided, the first and second backplane being arranged in a stackup.

This is achieved by providing through holes in the first backplane, under the contact pads, and provide electrical binding means in the through holes to connect to the second backplane. Preferably, the electrical binding means are provided by nano entanglements.

Second Part

Currently LEDs are positioned on a multilayer PCB structure, which is good for driving circuit designs, but expensive to produce if going to smaller components.

TFT technology on the other hand is cheaper for realizing large and detailed circuits (such as LCD Panels). However, TFT technology requires a a flat surface for producing it. Glass is mostly used for that. A drawback of TFT on Glass is that multilayers, connected with via's, are not cheap to produce than using TFT on glass. Another problem when using TFT on glass with this limited number of layers is the fact that there is a considerable voltage drop on the tracks from one side to the other. Because the same area on one layer is used for circuits, for components and for connection tracks, the width of these tracks is therefore limited and causes non negligible electrical resistance for driving rows and/or columns.

The above problems can be overcome by splitting the electronic functions in different layers. A first layer, or first backplane, may comprise fine driving circuits and electrical components such as light emitting elements. Secondary layers may provide additional functions (such as power) and via connections for the light electrical components. The single layer functions can be made on a TFT substrate, and the additional functions can be spread over the different secondary layers, for example on a PCB. These secondary PCB layers can be added on top and/or bottom of the first TFT layer.

A multilayer stacked construction can thereby be provided, possibly with hybrid materials: a stiff and flat material (e.g., glass) needed as a substrate for TFT circuits, conductive material (e.g., copper) and insulating material (e.g., PI or FR4). TFT circuits can be made on PI as well, as explained above, with glass as a base substrate for flatness. The glass can be used during the process of creating the TFT circuits and be removed afterwards, using only the PI layer, resulting in a multilayer PCB with TFT inside.

Connections of the TFT layer with the other layers can be done at the sides with side flex foil connections, but also with classic via's if PI with removed glass would be used for the TFT layer.

Driver Chips, as well as interconnections for power and driving can be arranged at the bottom outer side of the multilayer hybrid stack up.

Wires can be connected to the third backplane by either direct soldering on the third backplane or by using a type of connector. These contacts can be connected on the PCB to side-contact(s) and be distributed on the first and second layer, according to design requirements (current, voltage, etc.).

As state of the art, copper is used as a top layer of a TFT for creating Data and Scan tracks, but because these tracks are only about 1 micrometer thick, they would generate considerable time delay at the end of such Data and Scan tracks.

To relieve the TFT layer from electronic driving functions, the inventors have thus imagined providing a third backplane on top of the TFT layer which comprises the light emitting elements. Cavities should then be provided at the locations of the light emitting elements to enable them to emit light.

The third backplane may comprise a layer comprising circuits for the ground and a layer comprising circuits for providing power. The thin film transistor layer comprises thus a plurality of light emitting elements, associated contact pads, conducting tracks and driving means.

The third backplane may for example be provided by a PCB backplane. Throughout the description, it is referred to PCB on top, top PCB or PCB backplane. However, the invention is not limited thereto.

Providing the ground layer in the third backplane, or top PCB has the advantage that the entire thickness of the copper in the layer is available for the ground over the surface of the light emitting module. The voltage drop over the light emitting module is then minimized by providing wider tracks in the PCB. The TFT layer is not capable of providing such wide tracks. The thickness of a track in a TFT layer is about 1 micrometer, which results in considerable electrical resistance. To avoid that, the tracks needed for applying power and ground, can be taken out of the TFT electronics, and be provided by the third backplane, or PCB on top.

Cavities for the light emitting elements should be provided. As explained throughout the specification, the cavities offer additional advantages.

A schematic representation of the third backplane, represented by a PCB, is shown in FIG. 3A as an example. In this example, the third backplane 800 is provided by a double copper layer PCB, a lower layer 830 and un upper layer 810. In between the lower and upper layer is an insulating layer 820. Cavities 840 for receiving the light emitting elements are provided in this third backplane 800.

This third backplane 800 can be arranged on top of a single TFT backplane deposited on any insulating substrate, such as a glass substrate for example (not shown). Additional layers on the top PCB may be provided as well. A second backplane for example an extra PCB (not shown), may also be arranged under the first TFT backplane. This hybrid construction with alternating TFT and PCB layers may be repeated multiple times. This hybrid construction is described in the third part of the specification.

The third backplane comprises cavities at the locations of the light emitting elements. It further comprises at least a lower layer which is arranged on the first backplane and un upper layer. The lower and upper layer can be provided by any one of a ground layer or power layer for contacting the light emitting elements. The upper layer can thus be the power layer and the lower layer can be the ground layer or the upper layer can be the ground layer and the lower layer can be the power layer.

The cavities can be metalized for connecting the upper layer to the lower layer.

In addition, each cavity can be surrounded by an insulating ring thereby providing an isolated island around each cavity, such that the functionality of the upper layer is transmitted to the isolated island, the isolated island thereby comprising the power if the upper layer is the power layer or the ground if the upper layer is the ground layer.

In the example illustrated in FIG. 3A, the upper layer is provided by a ground copper layer 810 and the lower layer is provided by a power copper layer 830. In between the copper layers is an insulating layer 820, such as PI or FR4 for example.

Cavities 840 suitable to be arranged around each light emitting element of the first backplane are provided in the third backplane.

Figure 5:
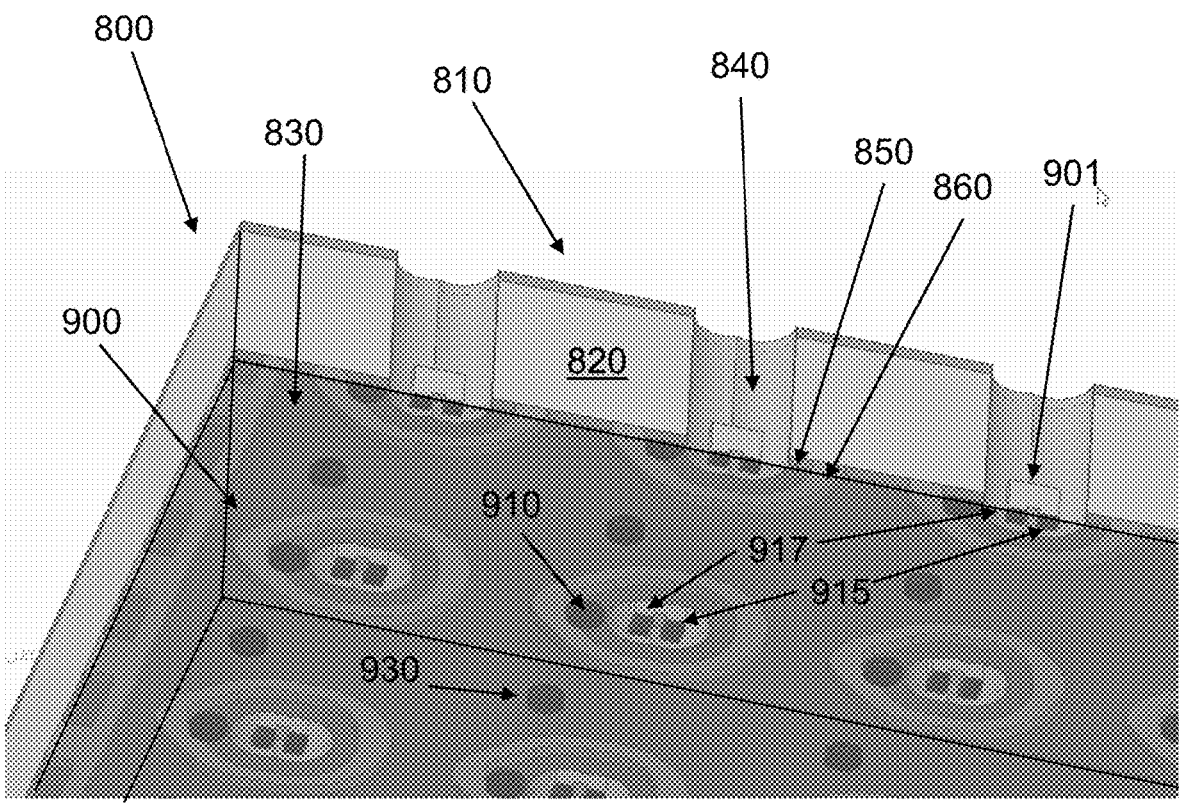
FIG. 5 is a representation combining the FIG. 3C and FIG. 4B to illustrate the connections of the light emitting elements to the power and ground layers.

FIG. 3B illustrates the bottom power layer 830, wherein the cavities 840 are also visible. FIG. 3C shows additional details of the bottom power layer 830, and additional details of the cavities 840. By metalizing the walls of the cavities 840, a connection from the ground top layer 810 is provided through the metalized cavity to the power lower layer 830. The insulating ring 860 isolates a ground island 850 around the cavity 840 on the lower layer from the power copper layer 830. Thus, the light emitting elements can be easily connected to the ground and the power via this technique, as shown in FIG. 5.

Therefore, conducting tracks of the light emitting elements provided on the TFT layer are configured to connect each contact pad to a ground connection and a power connection, wherein the ground and power connection are configured to be in contact with the lower layer of the third backplane and the isolated island or the contrary.

Figure 4A:
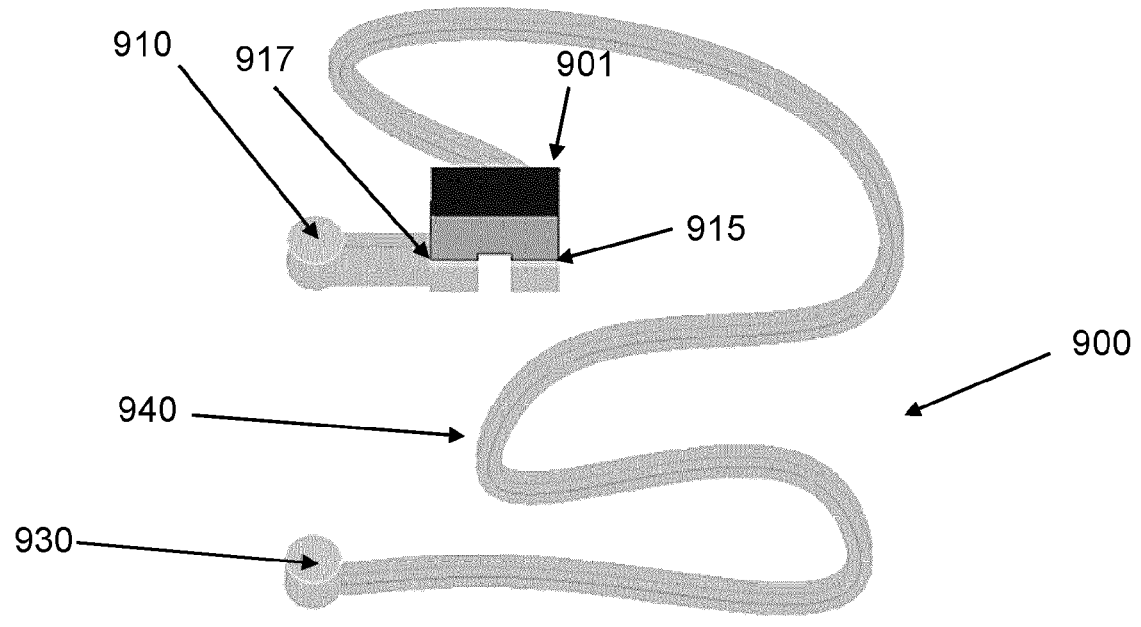
FIG. 4A is a schematic representation of a LED circuit embedded in a TFT substrate.

FIG. 4A is a schematic representation of a LED circuit embedded in a TFT substrate 900. A LED 901 is connected to the TFT substrate 900 at the anode 915 and the cathode 917 connections. The cathode is connected to a ground connection 910. From the anode 915, a conducting track 940 connects the LED to a power connection 930.

Figure 4B:
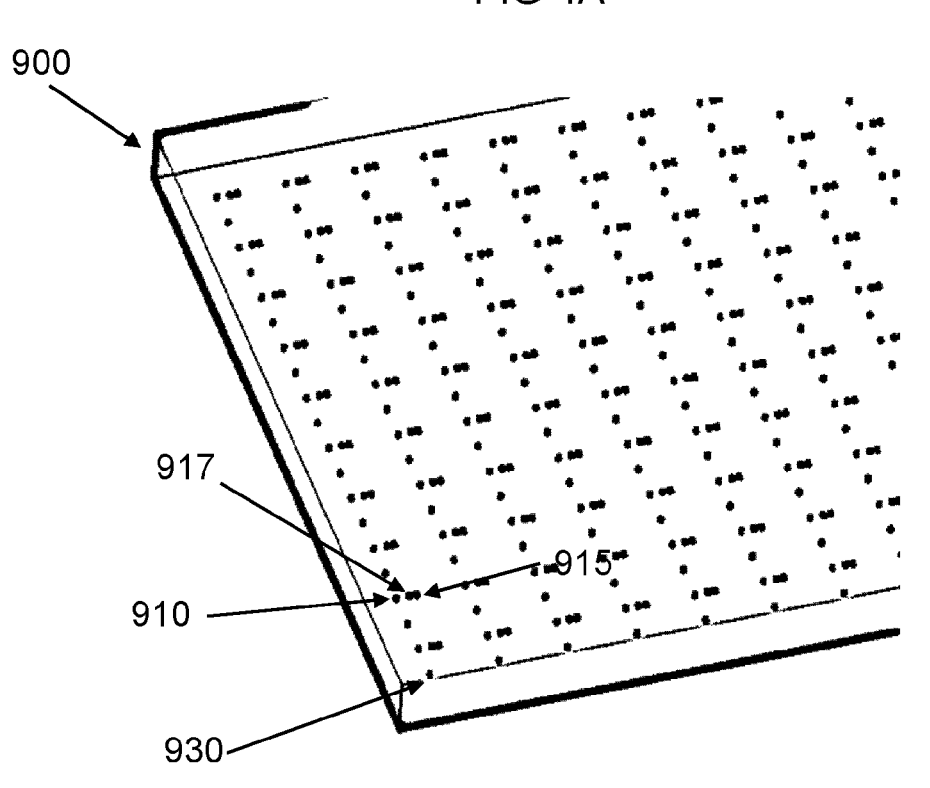
FIG. 4B is a schematic representation of the LED connections on the TFT substrate.

FIG. 4B shows this arrangement of connections in the TFT substrate 900 for a plurality of LEDs.

FIG. 5 shows the combination FIG. 3C and FIG. 4B with the LEDs 901 connected. The ground isolated island 850 is connected to the ground connection 910 on the TFT substrate 900. The power connection 930 on the TFT substrate is connected to the power lower layer 830.

The third backplane may also comprise additional layers.

Instead of providing two copper layers in the top PCB for the ground and the power, additional layers may be provided, to further relieve the TFT layer from additional circuits. The advantage of providing additional copper layers in the PCB is that these extra copper layers in the PCB are thicker than in the TFT layer, which is normally used for finer tracks. In TFT, generally only the top layer is copper, the other layers being usually based on Aluminum, having a greater electrical resistance than Copper, resulting in considerable voltage drops over longer tracks, but also in lower possible driving speeds. Not only Power and Ground preferably have lower resistance, also the Data columns for R, G and B, as well as the scan rows may benefit from lower resistance. If more than 2 layers are used in the PCB for taking over these functions, then also more vias would be necessary to connect each layer to the lower TFT surface. With tightly stuffed small LEDs, at a smaller pitch, not sufficient space may be available between the LEDs to arrange all these vias.

The solution proposed by the inventors is to use the metalized cavities around each LED as vias for connecting the various layers.

For example, provided a set of four pixels (each with a R, G and a B LED) is addressed for driving them, then this group comprises 12 LEDs, meaning that 12 cavities are available as a via. Six vias are already sufficient for connecting the six different layers for Power, Ground, Data R, Data G, Data B and Scan lines. For each set of pixels, such a structure can be repeated.

It is the combination of the metalized cavity wall and the selection of layers which comprise an insulating ring directly around the cavity wall or around an isolated island around the cavity wall which determines which signals are routed to which layer.

The cavities can be metalized for connecting the upper layer and the intermediate layers to the lower layer.

The lower layer can thus comprise an isolated island around each cavity, the isolated island being configured to connect to another layer by means of the metalized cavity wall.

Providing the appropriate arrangement of isolated islands (insulating ring being larger than the cavity) and insulating rings (directly around the cavity) appropriately may thus provide the desired connections between the layers by means of the metalized cavity walls.

The layers which are to be connected by the metalized cavity wall to the lower layer may comprise an isolated island on the layer around the cavity wall. On the other hand, the layers which are not to be connected by the metalized cavity to the lower layer may comprise an isolated ring around the metalized cavity wall.

Figure 6:
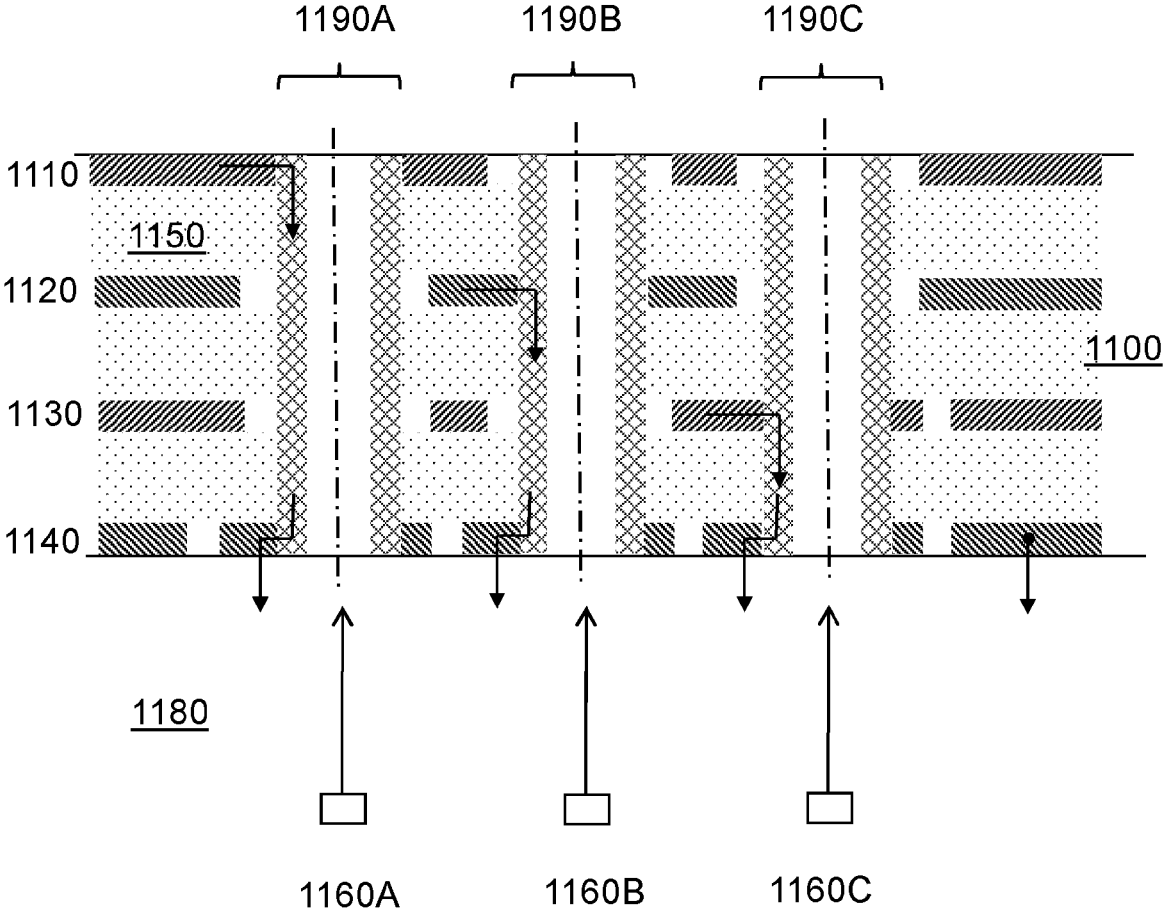
FIG. 6 is a schematic view in cross section of a PCB comprising four layers and cavities for connecting the different layers.

This is illustrated in FIG. 6. FIG. 6 is a schematic representation of a PCB 1100 comprising four layers provided on top of a TFT substrate 1180. The PCB comprises an upper ground copper layer 1110, a data copper layer 1120, a scan copper layer 1130 and a power copper layer 1140, each separated by insulating layers 1150, for example FR4. Three LEDs 1160A, 1160B, and 1160C are illustrated, each LED having its own cavity 1190A, 1190B and 1190C, respectively. The arrows illustrate the routing of the signals from the various layers towards the lower layer 1140 such that they reach the LEDs on the TFT substrate. In cavity 1190A, the connection between the ground layer and the TFT substrate via the metalized cavity is shown, which is made possible by providing an insulating ring around the cavity in layers 1120 and 1130. In cavity 1190B, the connection between the data layer and the TFT substrate is shown, which is made possible by providing an insulating ring around the metalized cavity in layers 1110 and 1130. In cavity 1190C, the connection between the scan layer and the TFT substrate is shown, layers 1110 and 1120 having both an insulating ring around the metalized cavity wall. A direct connection between the power layer and the TFT substrate is also illustrated.

FIG. 6 illustrates a third backplane having four layers. Additional layers may also be provided. For example, layers for transmitting data signals can be separated in a plurality of layers, for example one layer per sub-pixel color. One pixel may be composed of for example a red, a green, and a blue sub-pixel, which are provided by red, green, and blue light emitting elements. Then, there may a layer for the transmitting the red data signals (R data), a layer for transmitting the green data signals (G data), and a layer for transmitting the blue data signals (B data). The third backplane can preferably comprise six layers: a ground (GND) layer, a power (PWR) layer, a R data layer, a G data layer, a B data layer, a Scan layer. This provides a decimation of the resistance and hence the time delay can be considerably improved.

In general, the colors of sub-pixels composing a pixel are at least red, green, blue, and may further comprise any one of red, green, blue, white, yellow, cyan, magenta or any other color. One layer may be provided for each type of sub-pixel, such that the driving can be adapted.

In addition, the cavities may be used to provide secondary optics to the light emitting module. In fact, the cavities can be used to provide additional optical enhancement functionalities. If the cavities are deep enough, different functionalities may also be combined within a cavity. Such secondary optics or optical enhancement functionalities comprise quantum dots, light scattering means, contrast enhancing means, light directivity means, light absorbing particles, polarization filter for 3D applications, etc. For example, black particles may be provided inside the cavities for enhancing the contrast.

The cavities may thus also be used for providing quantum dot fillings. The use of quantum dots enables the separation of colors by means of quantum dots materials.

Figures 7A, 7B:
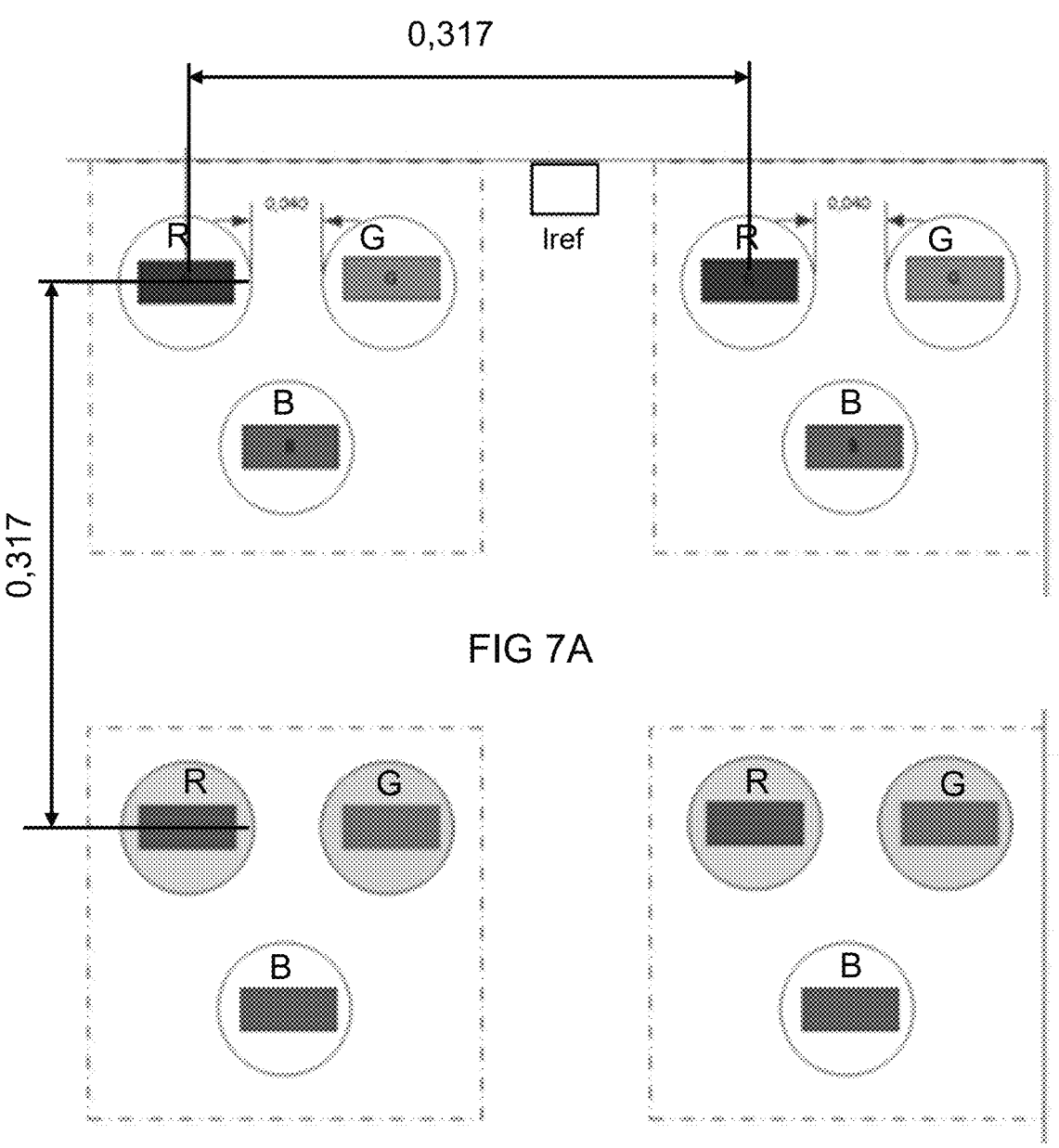
FIG. 7A is a schematic representation of a display with three RGB LEDs.
FIG. 7B is a schematic representation of a display with RGB quantum dots provided with identical LEDs.

FIG. 7A illustrates the use of three different LEDs, i.e., a red, a green, and a blue.

FIG. 7B illustrates the use of quantum dots inside the cavities. For example, the LEDs may emit light in the appropriate bandwidth for the quantum dots, i.e., in the blue/UV. The quantum dots may then be provided for each color, red, green, and blue. The blue color may also be provided directly with a blue LED, and without quantum dots.

In the example shown each LED measures 24×54 µm, the cavities have a diameter of 75 µm, the spacing between cavities is 40 am step, and the pixel pitch is 0.317 mm. Such a diameter is slightly larger than the one of the light emitting elements.

The use of quantum dots enables to populate the light emitting module with single color LEDs, which reduces the cost and increases efficiency. In fact, the light emitting module is easier to manufacture when all light emitting elements are identical. In addition, all light emitting elements would have the same behavior and there is thus no need to compensate for their different driving.

For the blue color, the use of blue LEDs is particularly advantageous as blue LEDs are available off the shelf.

In addition, metalizing the walls of the cavities may not only provide electrical means it also improves the light emission properties of the display. In fact, the cavities provide a higher reflection percentage. As there is less interference of light emitted by neighboring LEDs, a better definition of the colors is provided.

On top of the top copper plane of the PCB, a black mask for enhancing contrast to the viewer can also be provided.

While TFT has been illustrated on glass, it is also possible to use TFT on PI as in the first part of the present invention. It is further possible to combine the first part and the second part of the specification, with or without the through holes in the flexible substrate of the first backplane.

This solution of providing a hybrid TFT PCB LED module offers many advantages. The voltage drop is minimal by using copper planes instead of tracks in the TFT layer, due to the increased thickness of the copper planes in the third backplane.

The walls of the LED cavities can further be coated as vias to connect for example the upper ground copper layer with ground islands at the lower layer of the PCB on top.

In addition, this metalized coating on the walls of the cavities increases the reflection percentage, thereby reducing unwanted interferences between light emitted by neighboring LEDs and improving the contrast of the display.

As mentioned above, below the TFT layer, a second PCB can also be applied with extra layers to provide additional functionality.

At the bottom of this PCB, additional components such as BGA Chips and/or connectors can be positioned on the outside.

The display module can be made monolithic by providing at least a first backplane with light emitting elements and driving means, at least a third backplane on each first backplane, for example provided by a PCB on top, and a second backplane, for example provided by a PCB, which further provides a mechanical support to the display module and an electrical interface for providing driving and power signals from the outside to the display module.

The dimensions of the light emitting modules can be of any size and range from one pixel to a matrix of thousands of pixels. For example, the module size can be a single pixel (three sub-pixels (R LED, G LED and B LED) for example, or four sub-pixels (R, R, G and B LED or R, G, G and B LED or R, G, B and B LED) are possible to form one pixel) provided with limited driving electronics. A light emitting module can also be the size of a post stamp with multiple pixels (tens to hundreds of pixels) or even have the dimensions of a screen (thousands of pixels). One advantage of providing smaller light emitting modules is the control of the yield. If one module has a defect, only a limited number of LEDs would have to be replaced. Another advantage is that a post stamp sized module is easier to handle with existing positioning machinery (pick and place robots) than single small sized micro LEDs.

The third backplane may also act as shielding for EMI (electromagnetic induction). In fact, the copper layer arranged around the light emitting elements acts as an electromagnetic shielding cavity with conductive material. In addition, it also helps to distribute the heat coming from the light emitting elements more evenly over the light emitting module, and thereby reduces the appearance of hot spots on the display.

The connection of the third backplane to the first backplane can be done for example using anisotropic conductive film (ACF), or conductive glue known as "UP 400" described for example in the following patent application: EP2722415A1, or the use of nano entanglements, as described in the following patent applications: EP3711462A1 and DE102018122007A. The use of solder ball is also possible. The electrical binding means described in the first part of the present application are also applicable here.

In addition, the third backplane can have a larger surface than the first backplane to hide the gaps between adjacent modules.

The third backplane can thus be provided by a PCB having at least two layers.

Figure 8:
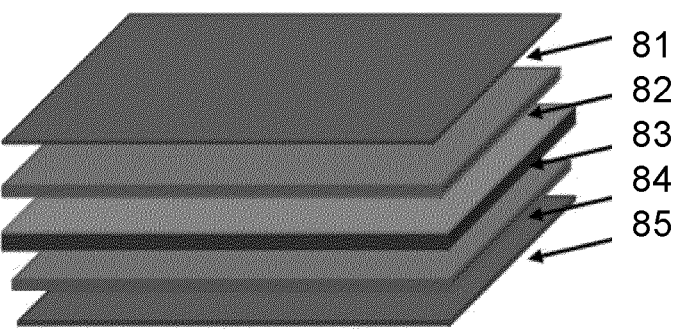
FIG. 8 is a schematic representation of a PCB with different layers.

FIG. 8 illustrates a PCB support having a plurality of layers, a top layer 81, a pre-preg layer 82, a core layer 83, a pre-preg layer 84 and a bottom layer 85. PCB manufacturing is based on starting with a copper laminate (e.g. ISOLA 370HR), which is a glass-woven or epoxy based layer, laminated on both sides with a copper layer (9-35 µm thick).

Depending on the number of required layers, extra layers (prepreg+Cu layer) are laminated, in most cases symmetrically to the core to avoid deformations.

The core can be a two-layer stackup, mostly available in large sheets or roll-to-roll. FIG. 8 illustrates a PCB with four layers.

If the routing is limited to two layers, the alignment of layer to layer is made during the etching process. If additional layers are added, the alignment is made based on positions of the layers and press. This may induce misalignments and high variation in the thickness, as shown in Table 1. This alignment is particularly critical for micro-LED applications due to the size of the LEDs.

The thickness of the core, with two layers, starts at about 50 µm+2×0.75 µm Cu=65 am overall thickness, which is in line with the luLED thickness requirements.

TABLE 1

| Example of standard thicknesses in 6 layer PCB Stackup Thickness of 6 Layer PCB (unit: mm) | | | | | | |
|---|---|---|---|---|---|---|
| Finished thickness | Tolerance | Prepreg 1-2 | Core 2-3 | Prepreg 3-4 | Core 4-5 | Prepreg 5-6 |
| 0.6 | ±0.1 | 0.08 | 0.065 | 0.14 | 0.065 | 0.08 |
| 0.8 | ±0.1 | 0.08 | 0.13 | 0.14 | 0.13 | 0.08 |
| 1.0 | ±0.1 | 0.14 | 0.13 | 0.24 | 0.13 | 0.14 |
| 1.2 | ±0.1 | 0.24 | 0.13 | 0.24 | 0.13 | 0.24 |
| 1.6 | ±0.1 | 0.24 | 0.33 | 0.14 | 0.33 | 0.24 |
| 2.0 | ±0.1 | 0.24 | 0.53 | 0.24 | 0.53 | 0.24 |
| 2.5 | ±0.1 | 0.24 | 0.73 | 0.24 | 0.73 | 0.24 |
| 3.0 | ±0.1 | 0.31 | 0.93 | 0.24 | 0.93 | 0.31 |

It is advantageous that the third backplane is provided by the core layer of the PCB, with two layers, as further described.

The minimal hole size available in a core layer is directly related to the core thickness. Since the pixel pitch and the LED sizes are decreasing with micro-LEDs, holes sizes also need to decrease accordingly.

As shown in the table below, drill sizes can be made in the PCB as small as 75 µm onwards in standard PCB industry.

Producible Hole Diameters:

TABLE 2

| Example of standard producible holes in PCB | | | |
|---|---|---|---|
| Type | Smallest Ø | Largest Ø | Max. aspect ratio |
| Drill hole npth | 200 µm | 6.0 mm (larger = milling) | 1:10 (rfq 1:12) |
| Drill hole pth | 75 µm | 6.0 mm | 1:12 |
| Blind via | 75 µm | 0.4 mm | 1:1 (rfq 1:1, 2) |
| Buried via | 75 µm | 0.4 mm | 1:12 |

By limiting the PCB to a single core laminate, an extra thin layer with very small, lasered holes (less than 100 am) is possible. It is therefore advantageous to provide a PCB core with a two-layer board, as it is processed in one step (no misalignments), and multiple copper thicknesses are available, from 50 to 300 microns. The thickness can be chosen to further reduce the voltage drop.

Micro LEDs have typically a diameter of about 54 microns. Therefore, a hole of about 75 microns, as shown in the table, would be perfectly compatible with micro-LEDs dimensions.

Since the core provides the ability to route two extra layers, the row/column matrix can be created on the PCB layer, between the light emitting elements, instead of the glass-top layer.

Figure 9:
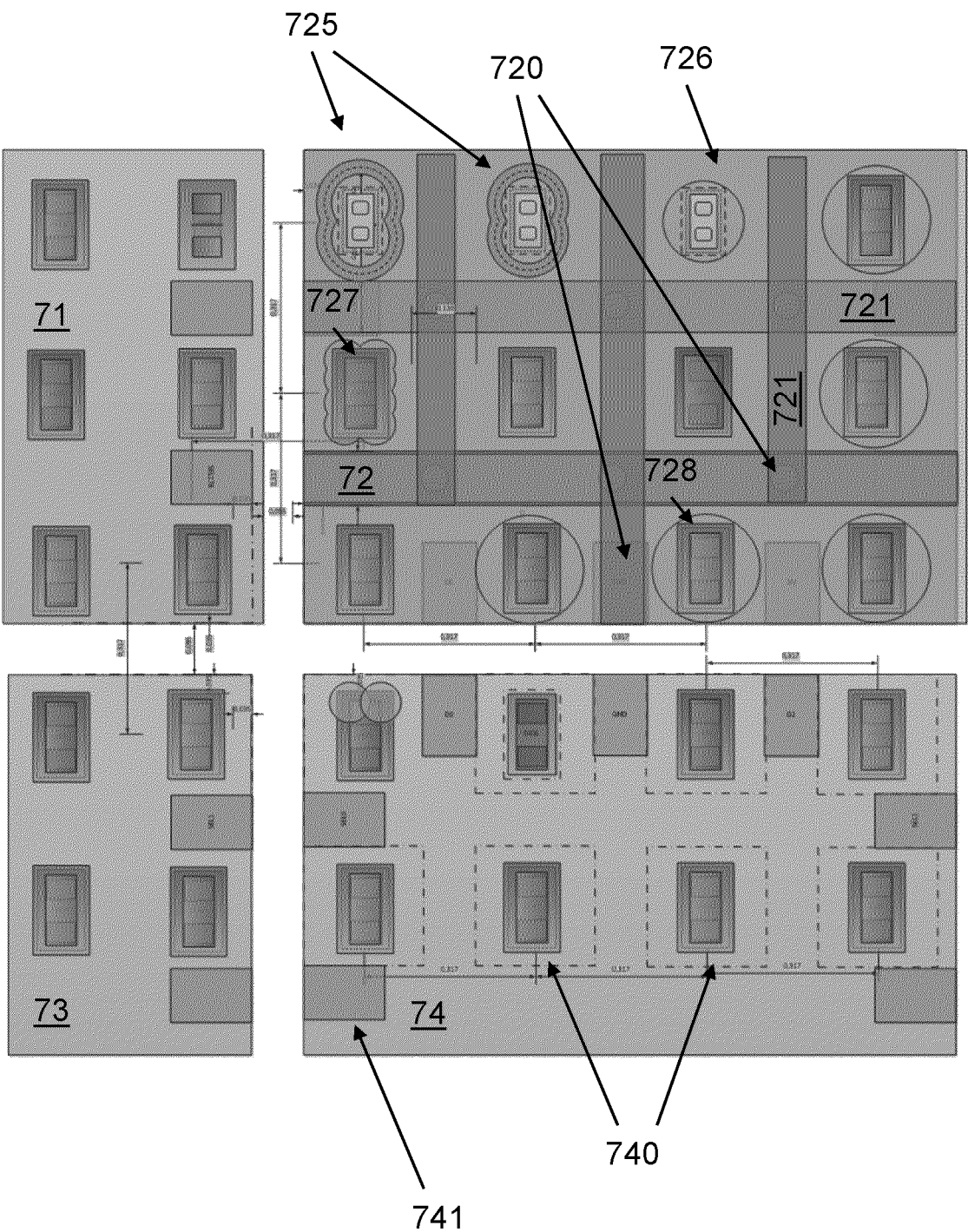
FIG. 9 is a schematic representation of a PCB and copper tracks.

FIG. 9 shows an example of how the PCB can be implemented with cavities for the placing the individual LEDs. The copper tracks 721 in the PCB layer are arranged in a matrix around the LEDs, and connections 720 to the top layer of glass are provided. By drilling multiple overlapping holes, shapes according to the LED structure can be created.

FIG. 9 comprises four parts, but the most relevant parts are parts 72 and 74. In part 74, the top layer of the TFT glass is shown wherein the µLED packages 740 (rectangles with 2 contact pads) and contact pads to the glass 741 (rectangles at the edges of the glass) are illustrated. This part shows only a section of a X by Y LED display and illustrates how the individual LEDs can be arranged. The LEDs can for example be R, G and B clustered.

Part 72 shows an example of how to enable extra Cu layers on top of the TFT layer by means of a multi-layered PCB. Items 721 and 720 are 2 traces, both on different layers of the third backplane, that are connected to the side-contacts of the PCB, which in turn are then connected to the top-TFT layer contacts by means of for example nano entanglements, or solder.

Due to the thicker Cu on the PCB (third backplane), the Power can be distributed (which is common for the complete panel) or high speed signals to control the driving and free up extra space on the glass-layer to be used for the TFT driving electronics.

In part 72, different possible shapes for the cavities are shown. For example, the cavities can be made with two larger holes 725 (with a laser for example), or with a plurality of holes 727, or one big hole 726. The smallest the cavity the better as the display will exhibit more contrast.

In part 71, there are areas defined around the µLEDs (i.e., openings in the PCB), either single hole or multiple small ones to easily follow the contour. Depending on the µLED shape (most cases rectangle due to the contact pads but not restricted, they can also be round, hexagonal, pentagonal shaped . . . )

The size of a single cavity depends on the diagonal of the rectangular shaped μLED, so the cavities 728 can be oversized in the horizontal direction.

As explained, the cavities can be metalized and can also serve as a contact-bridge between PCB and top-layer glass to provide multiple contact points along the surface of the panel.

Figure 10A:
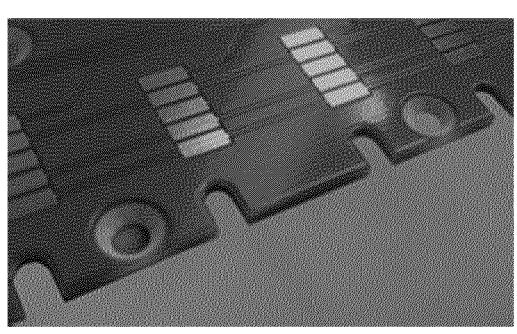
FIG. 10A is a schematic representation of a plated PCB with cavities configured to receive the light emitting elements.
Figure 10B:
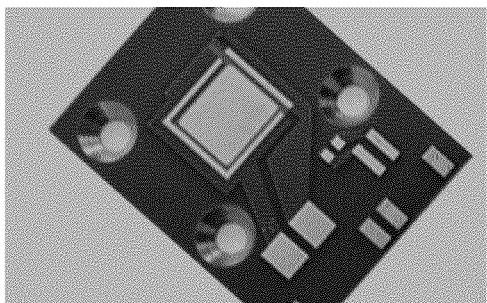
FIG. 10B is a schematic representation of a non-plated PCB with cavities configured to receive the light emitting elements.

The shape of the holes is not restricted to X and Y but can also be modified in the Z-direction to form a funnel shape to encapsulate the LED, as shown in FIGS. 10A (plated) and 10B (non plated). This enables the use of encapsulation material or Quantum Dots on top of the LED.

The solder mask on top of the PCB can be printed. This enables to either laser extra structures on the finished product or print extra features on top of the black layer, such as anti reflection coating, contrast enhancement coating, light traps, etc.

When the third backplane comprises more than two layers, these can be provided by a PCB multilayer stack-up. For example, as shown in Table 1, every prepreg is composed of one layer of copper and isolation material, the core is composed of two layers of copper and an isolator. Providing a prepreg on both sides of the core, results in a total of for example 4 layers, and the calculated thickness is thus 2×0.08+1×0.065. In most cases the third backplane will be made of a PCB which is symmetrical on both sides of the core layer, resulting in an even number of copper layers.

Third Part

As mentioned above, the first part and the second part described above can be combined, with or without the through holes described in the first part.

Figure 11:
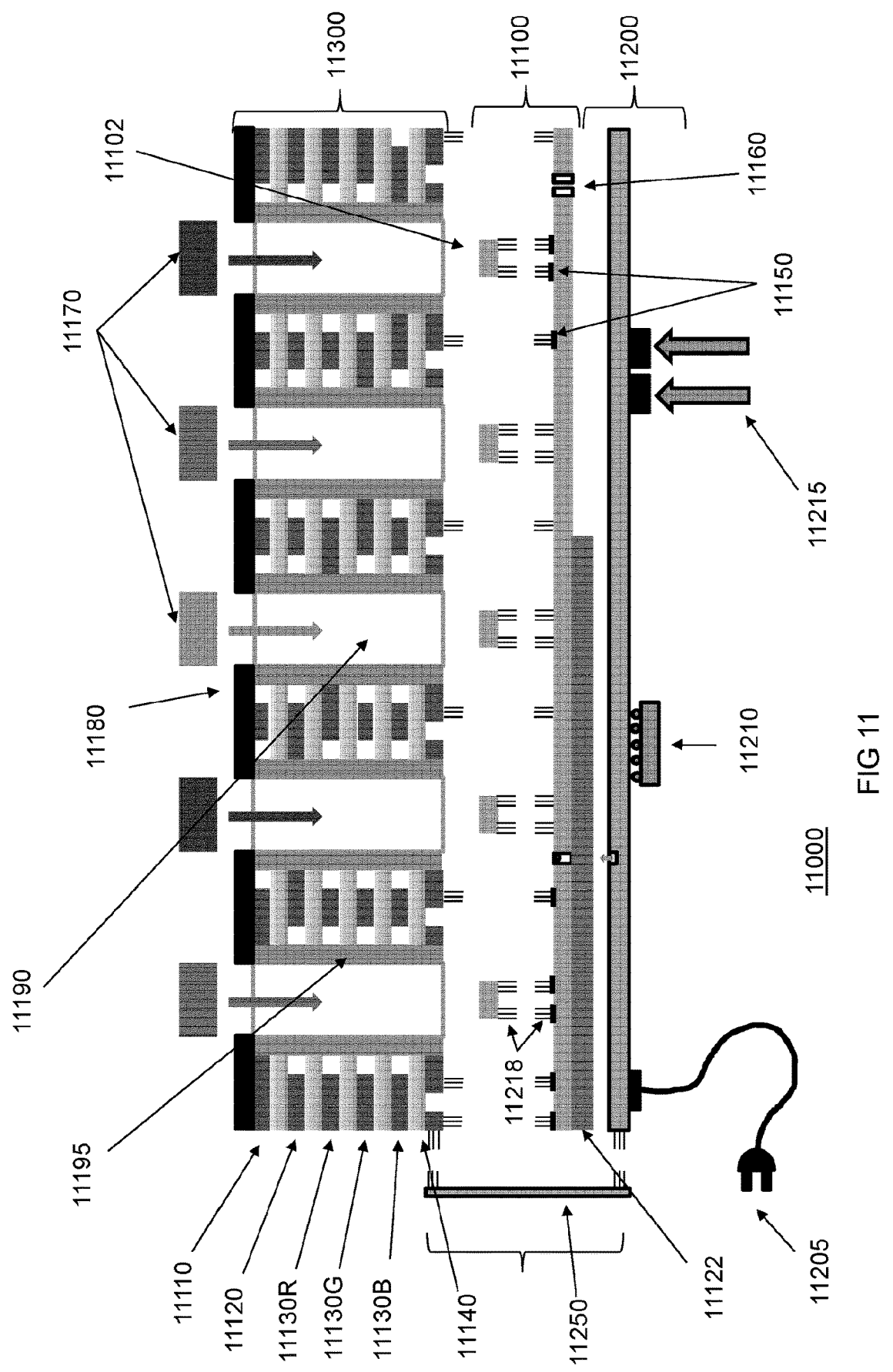
FIG. 11 is a schematic representation of a light emitting module comprising a first backplane, a second backplane and a third backplane.

FIG. 11 is a figure showing a possible combination of the examples described in the first part and in the second part of the present specification.

The light emitting module 11000 illustrated in FIG. 11 comprises a first backplane 11100, a second backplane 11200 and a third backplane 11300, arranged in a stackup.

The first backplane 11100 comprises a thin film transistor layer deposited on a first substrate and a plurality of light emitting elements 11102, associated contact pads and conducting tracks.

The third backplane 11300 is provided on top of the light emitting elements 11102, wherein the third backplane comprises cavities 11190 at the locations of the light emitting elements and at least a ground layer 11110 and a power layer 11140, said ground layer and power layer being arranged on the first backplane and un upper layer, wherein the lower and upper layer are provided by alternatively a ground layer and a power layer for contacting the light emitting elements.

Preferably, the ground layer is provided in the upper or top layer, as it additionally provides EMI shielding.

In the example of FIG. 11, the third backplane 11300 comprises six layers of copper. From top to bottom, the six layers comprise a ground layer 11110, a scan layer 11120, a red data layer 11130R, a green data layer 11130G, a blue data layer 11130B and a power layer 11140. The order of the layers can be adapted.

Cavities 11190 above each light emitting element are provided as described above. The cavities may comprise secondary optics 11170 such as quantum dots, light scattering means, contrast enhancing means, light directivity means, light absorbing particles, polarization filters, etc.

A black mask 11180 for enhancing contrast to the viewer can also be provided on top of the third backplane.

The cavities 11190 can also be metalized 11195 as described above. The various layers 11110, 11120, 11130RGB, 11140 may comprise an isolated island around each cavity, the isolated island being surrounded by an insulating ring, and the isolated island being configured to connect to another layer by means of the metalized cavity wall. In addition, the layers which are to be connected by the metalized cavity wall to the lower layer, here the power layer, may comprise an isolated island on the layer provided around the cavity wall.

The second backplane 11200 can be used to provide required signals to the third backplane, such as power, ground, and various data signals. The second backplane can be connected to the third backplane by means of a flexible PCB 11250 arranged on the side. It is also possible to connect the second backplane to the third backplane by means of nano entanglements.

The second backplane can be provided for example by a PCB, TFT on glass, etc. Additional secondary backplanes can also be provided under the second backplane to provide any required functions. As described above, the second backplane can be provided by a stackup of secondary backplanes comprising TFT on a substrate and PCBs, wherein the connections between the various components can be provided by the first and second electrical binding means described above, or a flexible PCB, etc.

The second backplane 11200 (or multiple secondary backplanes) or lower backplane of the stackup is configured to act as an interface to the outside world, and for example be connected to an external power connection, electronic driving components (for example by means of a BGA connection), and other I/O connections to the outside world.

The first backplane 11100 may be a thin film transistor layer deposited on a first substrate and connected to the second backplane by means of a flexible PCB for example. As described above, the thin film transistor layer may be deposited on PI for example, with the glass substrate 11122 or without, as illustrated in FIG. 11.

In addition, thin portions of copper 11150 may be provided on top of the TFT layer for connection to the third backplane. These portions of copper may be used in combination with nano entanglements 11218.

The first backplane 11100 may also be as described in the first part of the present description, such that it comprises a thin film transistor layer deposited on a first substrate, the thin film transistor layer further comprising a plurality of light emitting elements 11102 and first contact pads for contacting the light emitting elements and associated conducting tracks.

The second backplane 11200 then may comprise second contact pads configured to provide driving currents and power supply to the first contact pads of the light emitting elements, and wherein the first backplane further comprises through holes 11160 provided in the first substrate at the locations of each first contact pad.

First electrical binding means are then provided in the through holes 11160 of the first backplane and second electrical binding means are provided on the second contact pads of the second backplane the first and second electrical binding means being connected such that driving currents and/or power supply from the second backplane are transmitted to the first backplane.

While the invention has been described hereinabove with reference to specific embodiments, this was done to clarify and not to limit the invention. The skilled person will appreciate that various modifications and different combinations of disclosed features are possible without departing from the scope of the invention.

The invention claimed is:

1. A light emitting module for a light emitting display, comprising:

a first backplane and a third backplane arranged in a stackup, wherein the first backplane comprises a thin film transistor (TFT) layer deposited on a first substrate, the thin film transistor layer further comprising a plurality of light emitting elements, associated contact pads, conducting tracks and semiconductor material, the third backplane is provided on top of the light emitting elements, wherein the third backplane comprises cavities at the locations of the light emitting elements and at least a ground layer and a power layer, arranged each alternatively as a lower layer or an upper layer of the third backplane, wherein the lower layer is arranged on top of the thin film transistor layer of the first backplane, the lower and upper layers being configured to provide power to the light emitting elements.

2. The light emitting module according to claim 1, wherein the upper layer is the power layer, the lower layer is the ground layer or wherein the upper layer is the ground layer and the lower layer is the power layer.

3. The light emitting module according to claim 1, wherein an insulating layer is provided between the upper layer and the lower layer.

4. The light emitting module according to claim 1, wherein the cavities are metalized for connecting the upper layer to the lower layer, and/or wherein each cavity is surrounded by an insulating ring thereby providing an isolated island around each cavity, such that the functionality of the upper layer is transmitted to the isolated island, the isolated island thereby comprising the power if the upper layer is the power layer or the ground if the upper layer is the ground layer.

5. The light emitting module according to claim 1, wherein conducting tracks of the light emitting elements connect each contact pad to a ground connection and a power connection, said ground and power connection configured to be in contact with the lower layer and the isolated island or the opposite.

6. The light emitting module according to claim 1, wherein the third backplane further comprises intermediate conducting layers.

7. The light emitting module according to claim 6, wherein the intermediate conducting layers are any one of a scanning line layer, a R data layer, a G data layer, and a B data layer.

8. The light emitting module according to claim 6, wherein the cavities are metalized for connecting the upper layer and the intermediate layers to the lower layer and/or are funnel shaped.

9. The light emitting module according to claim 8, wherein the lower layer comprises an isolated island around each cavity, the isolated island being surrounded by an insulating ring, and the isolated islanded being configured to connect to another layer by means of the metalized cavity wall and/or wherein the layers which are to be connected by the metalized cavity wall to the lower layer comprise an isolated island on the layer around the cavity wall.

10. The light emitting module according to claim 8, wherein an insulating ring is provided around the metalized cavity wall on the layers not to be connected.

11. The light emitting module according to claim 1, wherein the signals are routed to at least one layer of the third backplane by side connections.

12. The light emitting module according to claim 1, wherein the third backplane is a PCB backplane.

13. The light emitting module according to claim 1, wherein a pixel is composed of a red, a green and a blue sub-pixel, the sub-pixels being provided by light emitting elements.

14. The light emitting module according to claim 1, wherein the first substrate is made of an insulating material configured to receive the TFT layer.

15. The light emitting module according to claim 1, wherein the light emitting elements are any one of LEDs, OLEDs, QD-LEDs, EL-QLEDs, AMOLEDs, mini-LEDs, or micro-LEDs.

16. The light emitting module according to claim 1, wherein the cavities are used for providing at least one secondary optics, wherein the at least one secondary optics includes quantum dots, light scattering means, contrast enhancing means, light directivity means, light absorbing particles, polarization filters.

17. The light emitting module according to claim 16, wherein the quantum dots and appropriate blue/UV light emitting elements are provided for any one of the red and/or the green and/or the blue color.

18. The light emitting module according to claim 16, wherein all light emitting elements are identical, and the quantum dot fillings are configured to provide any of red and/or green and/or blue colors.

19. The light emitting module according to claim 1, wherein the upper layer of the third backplane is covered by a black mask.

20. The light emitting module according to claim 19, wherein the additional layers are provided by a printed circuit board (PCB) multilayer stack up.

21. The light emitting module according to claim 1, wherein the third backplane is connected to the first backplane by means of any one of anisotropic conductive film (ACF), conductive glue, nano entanglements, or solder ball.

22. The light emitting module according to claim 1, wherein the surface of the third backplane is greater than the surface of the first backplane and/or wherein the third backplane is provided by the core of a multi layer PCB and/or wherein the thickness of the PCB core laminate is comprised in the range of 50 to 300 microns and/or wherein the diameter of the cavities is larger than the diameter of the light emitting elements.

23. The light emitting module according to claim 1, wherein a solder mask is printed on the upper surface of the third backplane.

24. The light emitting module according to claim 1, further comprising a second backplane, wherein the second backplane is arranged in the back of the first substrate of the first backplane, opposite the third backplane, wherein the second backplane is configured to provide at least driving currents and/or power supply to the light emitting elements.

25. The light emitting module according to claim 24, wherein the second backplane is connected to the first backplane by means of a flexible PCB, and/or nano entanglements arranged on the side and/or wherein the second backplane is connected to the third backplane by means of a flexible PCB and is configured to transmit at least one of power signals, data signals, ground.

26. The light emitting module according to claim 24, wherein the first backplane further comprises first contact pads for contacting the light emitting elements, and associated conducting tracks, the second backplane comprises second contact pads configured to provide driving currents and/or power supply to the first contact pads of the light emitting elements, wherein the first backplane further comprises through holes provided in the first substrate at the locations of each first contact pad, and wherein first electrical binding means are provided in the through holes of the first backplane and second electrical binding means are provided on the second contact pads of the second backplane the first and second electrical binding means being connected such that driving currents and/or power supply from the second backplane are transmitted to the first backplane.

27. A display module comprising the light emitting module according to claim 1.

28. A tiled display comprising at least one display module according to claim 27.

\* \* \* \* \*